US007474717B2

(12) United States Patent
Lindell et al.

(10) Patent No.: US 7,474,717 B2
(45) Date of Patent: Jan. 6, 2009

(54) OSCILLATOR FREQUENCY CONTROL

(75) Inventors: Bo Lindell, Lidingö (SE); Robert Kristiansson, Järfälla (SE)

(73) Assignee: Sony Ericsson Mobile Communications AB, Lund (SE)

( * ) Notice: Subject to any disclaimer, the term of this patent is extended or adjusted under 35 U.S.C. 154(b) by 596 days.

(21) Appl. No.: 10/535,632

(22) PCT Filed: Nov. 20, 2003

(86) PCT No.: PCT/EP03/13002

§ 371 (c)(1),
(2), (4) Date: May 20, 2005

(87) PCT Pub. No.: WO2004/047302

PCT Pub. Date: Jun. 3, 2004

(65) Prior Publication Data

US 2006/0013345 A1  Jan. 19, 2006

Related U.S. Application Data

(60) Provisional application No. 60/429,141, filed on Nov. 26, 2002.

(30) Foreign Application Priority Data

Nov. 21, 2002 (EP) ................................ 02025986

(51) Int. Cl.
*H04L 27/06* (2006.01)
(52) U.S. Cl. .................................... 375/344; 375/357
(58) Field of Classification Search ................ 375/371
See application file for complete search history.

(56) References Cited

U.S. PATENT DOCUMENTS

| 4,633,193 | A | * | 12/1986 | Scordo ....................... 331/1 A |
| 4,691,377 | A | * | 9/1987 | Yoshihara et al. ........... 455/256 |
| 4,849,993 | A | * | 7/1989 | Johnson et al. ............. 375/357 |
| 4,972,442 | A | * | 11/1990 | Steierman ................... 375/357 |
| 4,980,899 | A | | 12/1990 | Troost et al. ................ 375/108 |
| 5,113,416 | A | | 5/1992 | Lindell ........................ 375/97 |
| 5,172,075 | A | | 12/1992 | Yerbury et al. ................ 331/14 |
| 5,818,302 | A | | 10/1998 | Otsuka et al. ................ 31/17 |
| 6,339,625 | B1 | * | 1/2002 | Tsuchiya ..................... 375/354 |

FOREIGN PATENT DOCUMENTS

WO          WO 94/21048           9/1994

OTHER PUBLICATIONS

International Search Report dated Mar. 30, 2004 for corresponding PCT application No. PCT/EP2003/013002.

* cited by examiner

*Primary Examiner*—Shuwang Liu
*Assistant Examiner*—David Huang
(74) *Attorney, Agent, or Firm*—Myers Bigel Sibley & Sajovec, P.A.

(57) ABSTRACT

A control unit supplies a new control value to a frequency source. The value is determined by the frequency source frequency and the reference frequency. The control unit further calculates a rate of change value based at least on the new and a previous control value if there is communication with the reference frequency generator and stores these values in corresponding stores. Another control unit calculates a new control value based on the rate of change value from the rate of change store and the last used control value from the control value store and supplies the new control value to the frequency source if there is no communication with the reference generator.

18 Claims, 3 Drawing Sheets

OSCILLATOR FREQUENCY CONTROL

RELATED APPLICATIONS

The present application is a 35 U.S.C. §371 national phase application of PCT International Application No. PCT/EP2003/013002, having an international filing date of Nov. 20, 2003, and claiming priority to European Patent Application No. 02025986.7, filed Nov. 21, 2002, and U.S. Provisional Application No. 60/429,141, filed Nov. 26, 2002, the disclosures of which are incorporated herein by reference in their entireties. The above PCT International Application was published in the English language and has International Publication No. WO 2004/047302 A1.

TECHNICAL FIELD OF THE INVENTION

The present invention generally relates to the field of portable electronic devices and more particularly to a method and devices for the control of the frequency of a frequency source.

DESCRIPTION OF RELATED ART

Cellular phones include local oscillators for generating frequencies. These frequencies are used for among other things clocking of circuits within the phone.

It is well known that these oscillators are not exact in operation, but there is often a drift of the frequency generated because of among other things temperature variations and ageing of the oscillator. Because the frequency is less exact, there is a need for adjusting or controlling the frequency so that it is stable. There exist control schemes for adjusting the frequency based on the temperature of the oscillator. The temperature compensation schemes based on temperature are normally based on static conditions. Different parts of a phone can however have different temperatures, which results in that the temperature compensation is less accurate than when used in the static condition.

It is furthermore known to use the carrier wave that a base station communicating with a phone is using for transmission of signals as a reference frequency for the oscillator. The frequency of the oscillator is then adjusted to the reference frequency by a simple control unit in the phone. However, there is one problem with this adjustment and that is that the phone can lose connection with the base station. Then there is no contact with the reference frequency, with a consequent possible drift of the oscillator frequency. In the GSM specification there are furthermore certain frequency and timing drift limits that are not allowed to be exceeded during temporary loss of connection with a base station. Such loss can under normal circumstances be in the order of 1 to 2 minutes. This requirement can be hard to live up to if the drift is not compensated for also during loss of connection.

U.S. Pat. No. 5,113,416 describes a system for adjusting the frequency of transmission between a base station and a mobile station. The mobile station here detects the frequency of the signal received from the base station, determines whether the signal was received from the current base station and adjusts the output signal of a local crystal-controlled reference oscillator in accordance with the difference between the frequency of the output signal and the frequency of the received signal. This document therefore describes normal adjusting of frequency when contact is upheld with a base station. The document does not mention loss of connection with a base station U.S. Pat. No. 5,172,075 describes how a frequency source in a remote unit Is controlled to maintain a stable frequency. In normal operation the frequency source is locked to an external reference frequency. In the absence of the reference frequency, the temperature of the frequency source Is detected. Stored Information relating to control signals is used to generate a control signal for controlling the output frequency of the frequency source. This document thus describes controlling of an oscillator in a portable electronic device, when there Is no contact with a base station. The document also mentions that in one case the current temperature and the last control signal used for controlling the oscillator are used for calculating further control signals. The document is generally directed towards providing control of the oscillator frequency when there are long times of disconnection of the phone from the base station. An example given is in the order of several days. It furthermore uses the temperature of the oscillator to calculate control values and therefore needs to have a temperature sensor. Temperature sensors add to the costs of a device and also occupy more space, both of which are important to keep down in the field of cellular phones.

There is thus a need for a simpler way of controlling the frequency of an oscillator in a portable electronic device during temporary loss of connection with a base station.

SUMMARY OF THE INVENTION

The present Invention is therefore directed towards solving the problem of providing a simple and cost-efficent controlling of the frequency of a frequency source in a portable electronic device during temporary loss of communication with a reference frequency generator.

This problem is generally solved by calculating a rate of change value using the last used control value and at least the one control value immediately preceding the last control value used when contact was upheld with the reference source, and thereafter using this calculated rate of change value during temporary loss of communication.

One object of the present invention is thus to provide a portable electronic device having simple and cost-effective Implementation for controlling the frequency of a frequency source included in the portable electronic device during temporary loss of communication with a reference frequency generator.

According to a first aspect of the present invention, this object is achieved by a portable electronic device arranged to be communicating with a reference frequency generator and comprising:

a receiving unit receiving a reference frequency, a frequency source generating a frequency of the device, and at least one control unit arranged to:

in case of contact with the reference frequency generator:

supply a new control value to the frequency source, said value being determined by the frequency source frequency and the reference frequency, and calculate a rate of change value at least based on the new and a previous control value, in case of no contact with the reference generator:

calculate a new control value based on the rate of change value and the last used control value, and supply the new control value to the frequency source for controlling it.

A second aspect of the present invention Includes the features of the first aspect, further comprising a detecting unit, detecting if the device is in contact with the reference frequency generator or If contact is lost.

A third aspect of the present Invention includes the features of the first aspect, further comprising a control value store at least including the last used control value and a change of rate store at least including the rate of change associated with the last used control value.

A fourth aspect of the present invention includes the features of the first aspect, wherein there is a first control unit arranged to control the frequency source in case of contact with the reference frequency generator and a second control unit arranged to control the frequency source in case of no contact with the reference frequency generator.

A fifth aspect of the present invention Includes the features of the fourth aspect, further comprising a switch arranged to connect the first control unit with the frequency source in case the detecting unit detects connection and to connect the second control unit with the frequency source in case it does not.

A sixth aspect of the present invention Includes the features of the first aspect, further including a timer starting in case contact is lost with the reference frequency generator, wherein the control unit controlling the frequency source in case of no contact with the reference frequency generator is arranged to stop using the rate of change information if the counter reaches a predetermined value.

A seventh aspect of the present invention includes the features of the sixth aspect, wherein the timer is reset if contact with the reference frequency generator is established after being lost.

An eighth aspect of the present invention includes the features of the sixth aspect, wherein the predetermined value is dependent on the rate of change information. This has the advantage of stopping using rate of change values, when these are no longer reliable.

A ninth aspect of the present invention includes the features of the eighth aspect, wherein the predetermined value is high if the rate of change is low and is low if the rate of change is high.

A tenth aspect of the present invention includes the features of the first aspect, wherein it is a mobile phone and the reference frequency generator is a base station.

Another object of the present invention is directed towards providing a control device for a frequency source having simple and cost-effective implementation for controlling the frequency of the frequency source during temporary loss of communication with a reference frequency generator.

According to an eleventh aspect of the present invention, this object is achieved by a control device for a frequency source using an external reference frequency generator, arranged to:
  in case of contact with the reference frequency generator:
    supply a new control value to the frequency source, said value being determined by the frequency source frequency and the reference frequency, and
    calculate a rate of change value at least based on the new and a previous control value,
  in case of no contact with the reference generator:
    calculate a new control value based on the rate of change value and the last used control value, and
    supply the new control value to the frequency source for controlling it.

Another object of the present invention is to provide a method of controlling a frequency source that is simple and cost-effective to implement for controlling the frequency of the frequency source during temporary loss of communication with a reference frequency generator.

According to a twelfth aspect of the present invention, this object is achieved by a method of regulating a frequency source in a portable electronic device, comprising the steps of:
  in case of reception of a reference frequency from an external reference frequency generator:
    supplying a new control value to the frequency source, said value being determined by the frequency source frequency and the reference frequency, and
    calculating a rate of change value at least based on the new and a previous control value,
  in case of no reception of reference frequency signals from the external reference frequency generator,
    calculating a new control value based on the rate of changed value and the last used control value, and
    supplying the new control value to the frequency source for controlling it.

A thirteenth aspect of the present invention includes the features of the twelfth aspect, further comprising the step of detecting reception or no reception of reference frequency signals.

A fourteenth aspect of the present invention includes the features of the twelfth aspect, further comprising the step of storing the supplied control value and in case of reception of reference frequency signals from the external reference frequency generator also the rate of change value.

A fifteenth aspect of the present invention includes the features of the twelfth aspect, further including the steps of: in case of no reception of reference frequency signals from the external reference frequency generator: counting the time during which no reference frequency signals are received and stopping calculating new control values if the time reaches a preset time limit.

A sixteenth aspect of the present invention includes the features of the fifteenth aspect, further including the step of resetting the time if reference frequency signals are received again.

A seventeenth aspect of the present invention includes the features of the fifteenth aspect, wherein the predetermined value is dependent on the rate of change value.

An eighteenth aspect of the present invention includes the features of the seventeenth aspect, wherein the predetermined value is high if the rate of change value is low and is low if the rate of change value is high.

The present invention has many advantages. It is simple and easy to implement. It does not use any complicated or uncertain calculations of how the state of the device effects the frequency drift, like temperature, ageing and applied voltage. It fulfils the GSM requirements on limits of timing and frequency drift during a temporary loss of connection to a base station. It is cost-effective. Since it is based on controlling the frequency by the frequency from the reference frequency generator, which is already used in many portable electronic devices, it only requires small modifications of the device.

It should be emphasized that the term "comprises/comprising" when used in this specification is taken to specify the presence of stated features, integers, steps or components, but does not preclude the presence or addition of one or more other features, integers, steps, components or groups thereof.

BRIEF DESCRIPTION OF THE DRAWINGS

The present invention will now be described in more detail in relation to the enclosed drawings, in which.

DETAILED DESCRIPTION OF EMBODIMENTS

The present invention relates to portable electronic device having a local frequency source. The portable electronic device according to the invention will in the following be described in relation to a cellular phone in a cellular network. This is just one example of a device according to the invention. It can also be a portable electronic device such as a lap top computer, a palm top computer, an electronic organizer, a smartphone or a communicator, as long as they can be connected to an external reference frequency generator. This can in the case of a lap top computer take place by using a PC-card or a similar device connected to the computer for communication with a cellular network.

Figure 1:
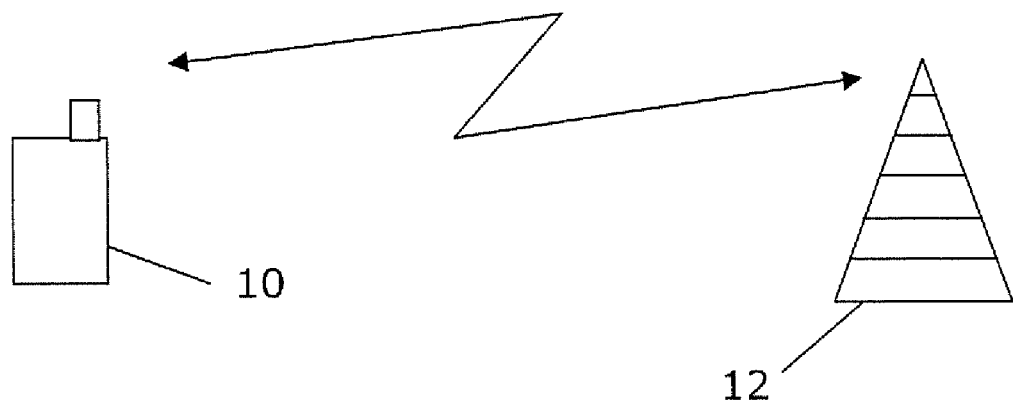
FIG. 1 schematically shows a cellular phone communicating with a base station.

FIG. 1 schematically shows a phone 10 according to the invention. The phone communicates with a base station 12 of a cellular network. During this communication both the phone and the base station modulate transmitted signals on a carrier wave. The base station 12 is thus equipped with a frequency generator, generating the frequency of the carrier wave. The phone 10 uses this carrier wave as a reference frequency for it's internal local frequency source, the details of which, will be described in more detail later on. The base station 12 thus includes a reference frequency generator for the phone 10.

Figure 2:
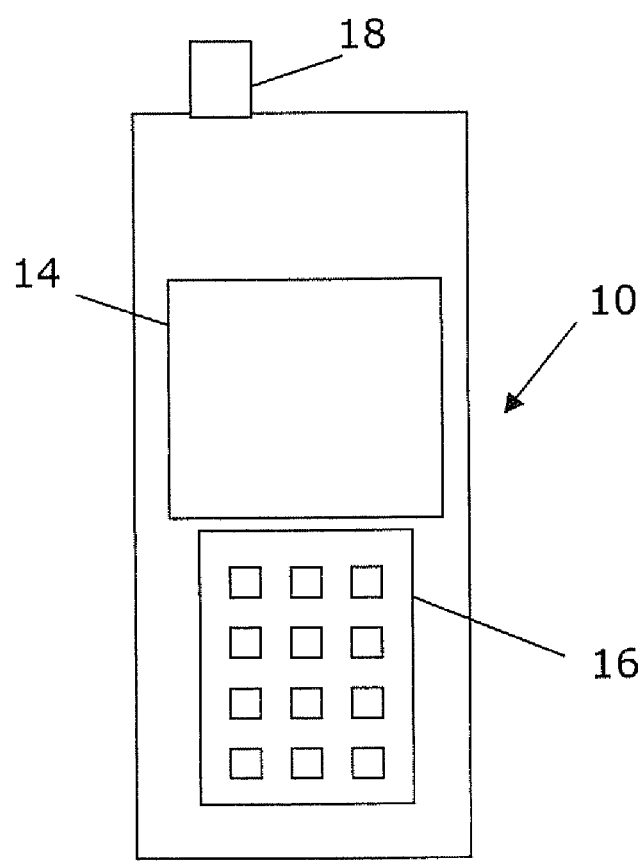
FIG. 2 schematically shows a top view of the phone according to the invention.

FIG. 2 shows a phone according to the invention. The phone 10 includes a display 14, a keypad 16 and an antenna 18 protruding from the body of the phone, which is used for communication with the base station. It should be realized that the antenna can, as an alternative, be in-built.

Figure 3:
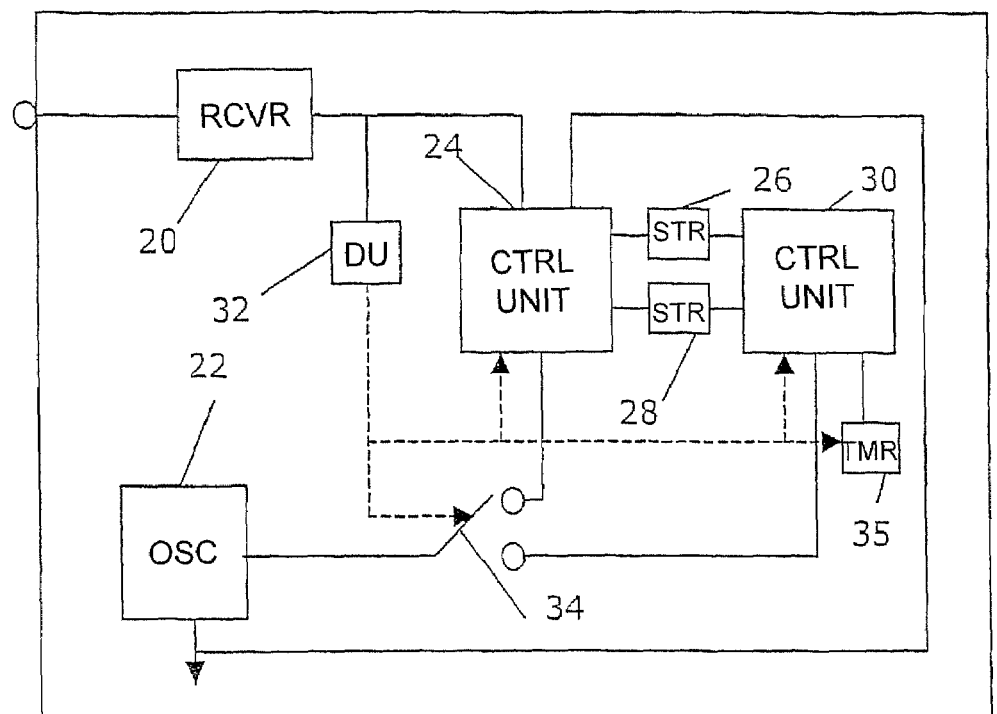
FIG. 3 shows a block schematic of the relevant parts of the phone according to a first embodiment of the invention.

FIG. 3 shows a block schematic of the relevant parts of the phone 10 according to a first embodiment of the present invention. The device includes a receiver 20 connected to the antenna (not shown). The receiver 20 is connected to a first control unit 24 as well as to a detecting unit 32. The first control unit 24 is connected to a control value store 26 and to a change of rate store 28. A second control unit 30 is also connected to the control value store 26 and to the change of rate store 28. The second control unit 30 is also connected to a timer 35. The detecting unit 32 controls a switch 34 via a control signal. The detection unit 32 also supplies the control signal to the first and the second control units 24 and 30 as well as to the timer 35. The supply of this control signal is indicated with dashed lines in the figure. The switch 34 is connected to a control input of the local frequency source 22, which in the preferred embodiment is a local frequency oscillator. The switch 34 is switchable between two positions, a first connecting the control input of the oscillator 22 with the first control unit 24 and a second connecting the control input of the oscillator 22 with the second control unit 30. The oscillator 22 also has an output providing an output frequency, to which output the first control unit 24 is also connected. The frequency of the local oscillator 22 is used in the phone for a number of things, where perhaps the most important one is as a base for providing clocking signals used for the different parts of the phone.

Figure 4:
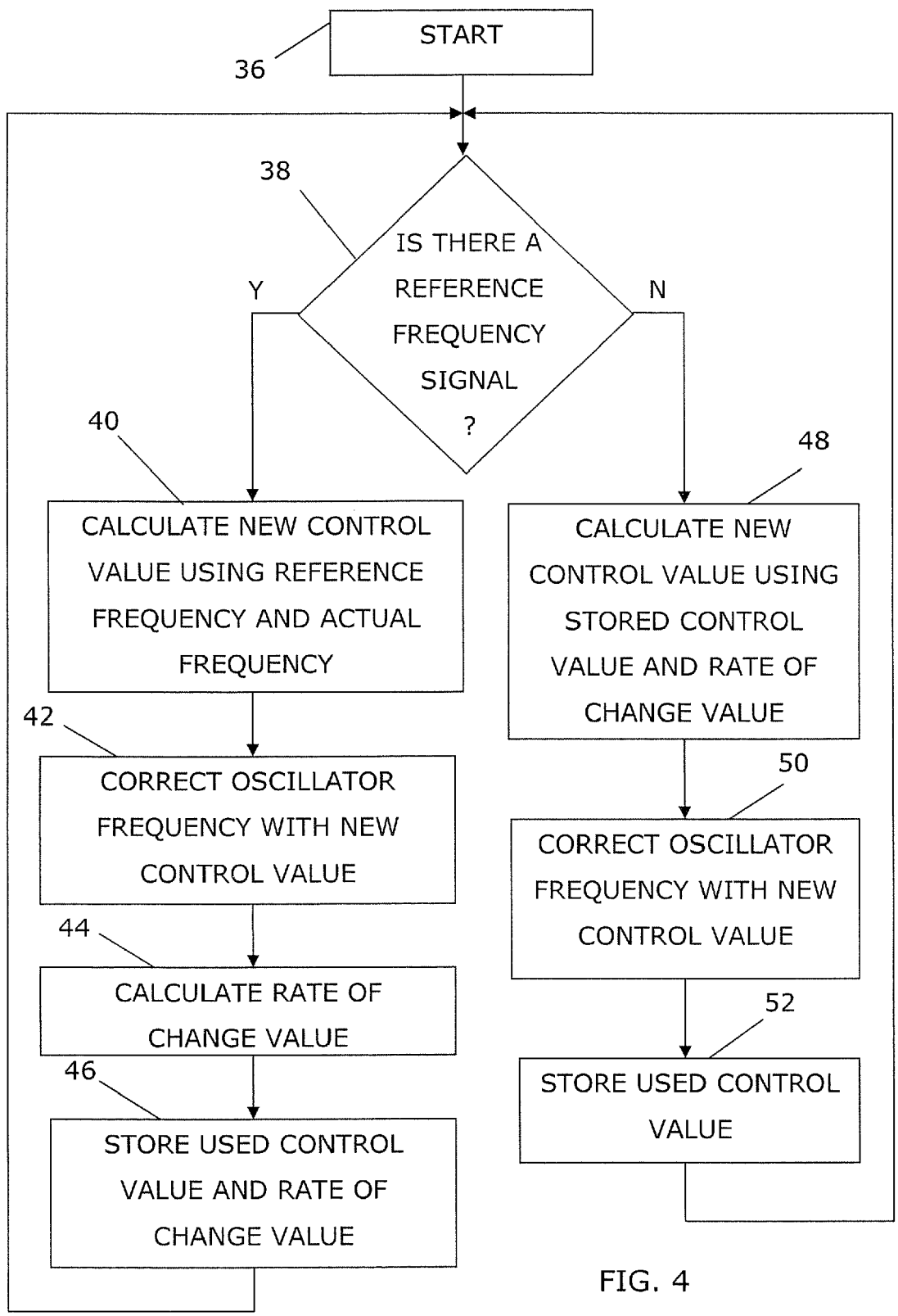
FIG. 4 shows a flow chart for performing the method according to the invention.

The way the present invention operates will now be described with further reference to FIG. 4, which shows a flow chart of the method according to the invention. The receiver 20 receives information modulated onto a carrier wave. The information is demodulated in the receiver 20 according to known principles and used in normal fashion in the phone. This is not a real part of the invention and is therefore not shown in the drawings and described further. The receiver 20 does however extract the frequency of the carrier wave for use as a reference frequency signal in order to control the local oscillator 22. This frequency is supplied to the first control unit 24. The presence of this frequency is also detected by the detecting unit 32 and used for providing the control signal switching the switch 34 to connect the control input of the oscillator 22 to the first control unit 24. The control signal of the detection unit 32 is also used for enabling the first control unit 24 and disabling the second control unit 30. The method is therefore started by the reception of the carrier wave in the first control unit 24, step 36. Thus, if there is a reference frequency signal present, step 38, the first control unit 24 is activated for control of the oscillator 22. In order to perform this controlling, the first control unit 24 receives the output signal of the local oscillator 22, i.e. the frequency to be controlled or actual frequency, and the received reference frequency and calculates a new control value based on these, step 40. The new control value is in its simplest form calculated by inputting the difference between the local oscillator frequency and the reference frequency. As an alternative this control can include an amplification of the difference. More complex ways of controlling the oscillator might be used, although it is preferred to keep it as simple as possible. Because of this control value, the oscillator 22 adjusts Its frequency so that it is set equal to the reference frequency. The reason for the need to adjust the oscillator frequency is that it experiences drift, which can be because of varying temperature or because of ageing of the oscillator. The temperature can be varying because of changes in the environmental temperature of the phone and as a result of internal power dissipation. The first control unit 24 then calculates a rate of change value associated with the new control value, step 44. This is in it's simplest version done by dividing the difference between the just used control value and a just previously used control value with the time interval between the values, i.e. calculating a derivative. More complex ways of calculating rate of change are also possible, like taking into account more previous control values. The most recently used control value is then stored in the control value store 26 and the rate of change value is stored in the rate of change store 28, step 46. These steps are then repeated for as long as there is a connection between the phone and the base station. In the preferred embodiment, the stores 26 and 28 only store one control value and one rate of change value at a time, where a new value replaces an earlier value. It is however possible to have more values stored such that the stores will include several earlier control values and several earlier rate of change values. These could then be used for more complex calculations of rate of change.

If contact is then temporarily lost with the base station the receiver 20 will not receive a reference frequency, step 38. No reference frequency is then output to the first control unit 24. The detecting unit 32 detects the absence of reference frequency and will then provide a control signal disabling the first control unit 24, enabling the second control unit 30 as well as switching the switch 34 to connect the second control unit 30 with the control input of the oscillator 22. Therefore the second control unit 30 will now start operating instead of the first control unit 24. The second control unit 30 then takes the last used control value stored in control value store 26 and the last calculated rate of change value stored in rate of change store 28 and calculates a new control value, step 48. The new control value is then supplied to the oscillator 22 for correction of its frequency, step 50. Thereafter the used control value is stored in the control value store 26, step 52. Note that no more rate of change values are calculated in this embodiment, but the same rate of change value is used for all new control values calculated during the time when no reference frequency signal is received. This is done under the assumption that the drift is linear, which assumption greatly simplifies the device. The above-mentioned calculations then continue to be made as long as there is no reference frequency available. It is possible that a more complex way of calculating rate of change is used, which uses several previous control values and interpolation for providing future rate of change values.

The thus described scheme provides a cost-effective and simple control of the local oscillator. This is especially the case since the controlling of the oscillator using the base station frequency is already used in known phones. With these schemes no real account is taken for the reason of the drift of the oscillator. The system just notes that there is a drift, how big it is and how it is changing by calculating rate of change and then applying this knowledge when no reference signal exists. There is no need for expensive or complicated temperature measurements or complicated models of how oscillators age or how frequencies change with temperature. This solution therefore works well when contact is temporarily lost with a base station, where the time of lost contact for example is in the region of a half to one minute.

The described method can be modified. The time the second control unit 30 can use the same rate of change value for calculating new control values is limited. If the rate of change is high, this time is short, but if it is low, it can be used for a longer time. The timer 35 therefore receives the control signal from the detecting unit 32. This timer 35 starts counting when no reference frequency is available and continues counting until one of two things happens. Either a reference frequency signal is received, which resets the timer 35 or the timer 35 reaches a predetermined value. The second control unit 30 continuously checks the status of the timer and when it reaches the predetermined value, the second control unit 30 stops calculating new control values and uses the same one all the time. The predetermined value can be set to different levels depending on how high the rate of change value is. If it is a high value, the predetermined value is low and if it is a low value the predetermined value is high.

The detecting unit, the two control units the switch, the timer and the two stores make up a control device for the oscillator.

Figure 5:
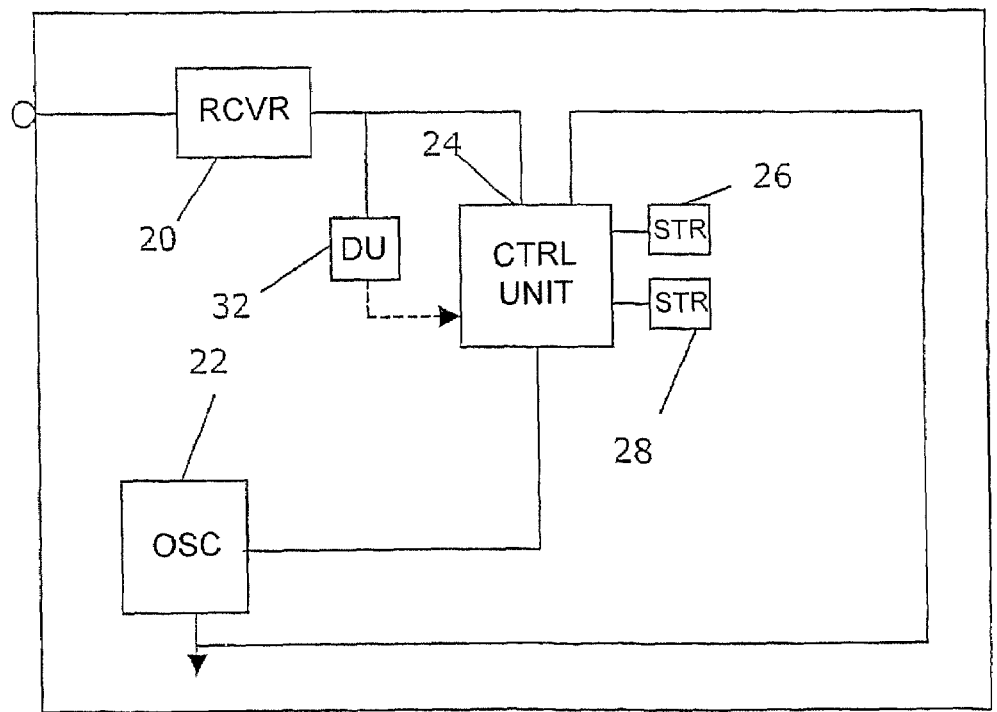
FIG. 5 shows a block schematic of the relevant parts of the phone according to a second embodiment of the invention.

There are many variations that can be made to the invention. The frequency of the carrier way does not have to exactly correspond to the desired frequency of the oscillator. It can be different, but then the correct reference frequency is obtained by dividing or multiplying the frequency of the carrier wave. It is furthermore not necessary to have two control units. It is equally as well possible to have just one, which is shown in FIG. 5 showing a block schematic of the relevant parts of the phone according to a second embodiment of the invention. Here the one control unit takes care of both phases of controlling, i.e. in case there is a reference frequency present and in case there is no such frequency present and changes mode of operation in dependence of control signal received from the detection unit 22. Therefore there is no switch. In the figure also the timer has been omitted. It should however be realized that it is fully possible to include such a timer though. In all other respects the second embodiment is identical to the first and therefore the same reference numerals are used as in FIG. 3.

The receiving unit is in the case of a cellular phone provided in the form of the actual radio receiver. In case the device is a laptop or other similar device communicating with a radio network via a PC card or similar device, the receiving unit is just an interface towards the PC card, where the carrier wave is received.

It is furthermore possible to vary the second embodiment even more. It is possible to include the detecting unit and the two stores in the sole control unit as well.

The control units are preferably provided in the form of a processor cooperating with program code stored in a program memory. The invention is therefore easy to implement in a phone by just adding some extra software, since some of it is already there. It also fulfils the requirements for limits on timing and frequency drift during loss of connection with a base station according to the GSM requirements. For these and other reasons the present Invention is only to be limited by the following claims.

The invention claimed is:

1. A portable electronic device configured to communicate with a reference frequency generator comprising:
    a receiving unit configured to receive a reference frequency,
    a frequency source configured to generate a frequency of the device, and
    at least one control unit configured to supply a new control value to the frequency source, said value being determined by the frequency source frequency and the reference frequency and to calculate a rate of change value at least based on the new and a previous control value if there is communication with the reference generator, and configured to calculate the new control value based on the rate of change value and a last used control value and to supply the new control value to the frequency source if there is no communication with the reference generator.

2. A portable electronic device according to claim 1, further comprising a detecting unit that is configured to detect if the device is in communication with the reference frequency generator or if communication is lost.

3. A portable electronic device according to claim 2, further comprising a first control unit configured to control the frequency source if there is communication with the reference generator and a second control unit configured to control the frequency source if there is no communication with the reference generator.

4. A portable electronic device according to claim 3, further comprising a switch configured to connect the first control unit with the frequency source if the detecting unit detects communication and to connect the second control unit with the frequency source if the detecting unit does not detect communication.

5. A portable electronic device according to claim 1, further comprising a control value store comprising the last used control value and a change of rate store comprising the rate of change associated with the last used control value.

6. A portable electronic device according to claim 1, further comprising a timer configured to start if communication is lost with the reference frequency generator, wherein the at least one control unit is configured to stop using the rate of change information if the counter reaches a predetermined value.

7. A portable electronic device according to claim 6, wherein the timer is reset if communication with the reference frequency generator is established after being lost.

8. A portable electronic device according to claim 6, wherein the predetermined value is dependent on the rate of change information.

9. A portable electronic device according to claim 8, wherein the predetermined value is high if the rate of change is low and is low if the rate of change is high.

10. A portable electronic device according to claim 1, wherein the portable electronic device is a mobile phone and the reference frequency generator is a base station.

11. An apparatus comprising:
a control device for a frequency source that uses an external reference frequency generator, the control device being configured to supply a new control value to the frequency source, said value being determined by the frequency source frequency and the reference frequency and to calculate a rate of change value at least based on the new and a previous control value if there is communication with the reference generator, and configured to calculate the new control value based on the rate of change value and a last used control value and to supply the new control value to the frequency source if there is no communication with the reference generator.

12. A method of regulating a frequency source in a portable electronic device, comprising:
if there is communication with the reference generator:
supplying a new control value to the frequency source, said value being determined by the frequency source frequency and the reference frequency; and
calculating a rate of change value at least based on the new and a previous control value;
if there is no communication with the reference generator:
calculating a the new control value based on the rate of change value and a the last used control value; and
supplying the new control value to the frequency source.

13. A method according to claim 12, further comprising detecting reception or no reception of reference frequency signals.

14. A method according to claim 13, further comprising:
storing the supplied control value; and
storing the rate of change value if reference frequency signals from the external reference frequency generator are received.

15. A method according to claim 13, further comprising:
if there is no reception of reference signals from the external reference frequency generator: counting the time during which no reference frequency signals are received; and stopping calculating new control values if the time reaches a preset time limit.

16. A method according to claim 15, further comprising:
resetting the time if reference frequency signals are received again.

17. A method according to claim 15, wherein the preset time limit is dependent on the rate of change value.

18. A method according to claim 17, wherein the preset time limit is high if the rate of change value is low and is low if the rate of change value is high.

* * * * *

UNITED STATES PATENT AND TRADEMARK OFFICE
CERTIFICATE OF CORRECTION

PATENT NO.         : 7,474,717 B2                                             Page 1 of 1
APPLICATION NO. : 10/535632
DATED              : January 6, 2009
INVENTOR(S)        : Lindell et al.

It is certified that error appears in the above-identified patent and that said Letters Patent is hereby corrected as shown below:

In the Claims:

Column 10, Claim 12, Line 4:   Please correct "calculating a the new"
                                To read -- calculating the new --

Column 10, Claim 12, Line 5:   Please correct "value and a the last"
                                To read -- value and a last --

Signed and Sealed this

Twenty-fourth Day of February, 2009

JOHN DOLL
*Acting Director of the United States Patent and Trademark Office*